(12) United States Patent
Laskaris et al.

(10) Patent No.: US 6,218,923 B1
(45) Date of Patent: Apr. 17, 2001

(54) MAGNET HAVING SHIELDING

(75) Inventors: Evangelos Trifon Laskaris, Niskayuna; Michael Anthony Palmo, Ballston; Michele Dollar Ogle, Burnt Hills, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/419,236

(22) Filed: Oct. 15, 1999

Related U.S. Application Data

(60) Provisional application No. 60/129,441, filed on Apr. 15, 1999, provisional application No. 60/129,438, filed on Apr. 15, 1999, and provisional application No. 60/129,439, filed on Apr. 15, 1999.

(51) Int. Cl.⁷ ..................................................... H01F 5/00
(52) U.S. Cl. ........................................... 335/299; 335/216
(58) Field of Search ................................... 335/216, 297, 335/299, 300, 301; 324/319–321

(56) References Cited

U.S. PATENT DOCUMENTS

| | | | |
|---|---|---|---|
| 4,689,591 | * 8/1987 | McDougal | 335/299 |
| 5,517,168 | 5/1996 | Dorri et al. | 335/301 |
| 5,517,169 | 5/1996 | Laskaris et al. | 335/301 |
| 5,565,831 | 10/1996 | Dorri et al. | 335/216 |
| 5,568,102 | * 10/1996 | Dorri et al. | 335/216 |
| 5,568,110 | 10/1996 | Dorri et al. | 335/216 |
| 5,570,073 | 10/1996 | Muller | 335/299 |
| 5,574,417 | 11/1996 | Dorri et al. | 335/216 |
| 5,594,401 | 1/1997 | Dorri et al. | 335/216 |
| 5,721,523 | 2/1998 | Dorri et al. | 335/216 |
| 5,801,609 | * 9/1998 | Laskaris et al. | 335/216 |
| 5,874,880 | 2/1999 | Laskaris et al. | 335/216 |
| 5,874,882 | 2/1999 | Laskaris et al. | 335/299 |
| 5,883,558 | 3/1999 | Laskaris et al. | 335/216 |

OTHER PUBLICATIONS

Laskaris et al., Application entitled "Open Magnet Having Shielding", filed Nov. 24, 1998, S.N. 09/199,096.
Laskaris et al., Application entitled "Open Magnet With Shielding", filed Nov. 24, 1998, S.N. 09/199,095.
Laskaris et al., Application entitled "Apparatus and Magnet For a Superconductive Magnet With Pole Piece", filed Aug. 31, 1999, S.N. 09/385,407.

* cited by examiner

Primary Examiner—Lincoln Donovan
(74) Attorney, Agent, or Firm—Marvin Snyder; Douglas E. Stoner

(57) ABSTRACT

A magnet, such as a closed, superconductive, magnetic-resonance-imaging (MRI) magnet, includes a main coil and includes a shielding coil positioned radially outward from the main coil. A magnetizable member is positioned radially outward from the main coil and radially inward from the shielding coil to supplement the strength, and increase the homogeneity of, the magnetic field created, at least in part, by the main coil and to supplement the shielding provided, at least in part, by the shielding coil.

19 Claims, 2 Drawing Sheets

MAGNET HAVING SHIELDING

This application claims priority of: a Provisional Application entitled "Hybrid Shield MRI Magnet" by Evangelos T. Laskaris et al., Ser. No. 60/129,441 filed Apr. 15, 1999; a Provisional Application entitled "Short Hybrid Shield MRI Magnet" by Evangelos T. Laskaris et al., Ser. No. 60/129, 438 filed Apr. 15, 1999; and a Provisional Application entitled "Hybrid Shield Short MRI Magnet" by Evangelos T. Laskaris et al., Ser. No. 60/129,439 filed Apr. 15, 1999; and is copending with U.S. patent applications, Ser. Nos. 09/419, 237 and 09/419,238 by Evangelos T. Laskaris et al, both filed Oct. 15, 1999.

BACKGROUND OF THE INVENTION

The present invention relates generally to a magnet, and more particularly to a magnet having shielding to protect the area around the magnet from stray magnetic fields originating from the magnet.

Magnets are used in diverse applications such as MRI (magnetic resonance imaging) systems. MRI systems include those employing superconductive magnets for medical diagnostics and procedures. Known superconductive MRI magnet designs include those having superconductive main coils each carrying a large, identical electric current in the same direction. The superconductive main coils create a static magnetic field within an MRI imaging volume which typically has the shape of a sphere centered within the magnet's bore where the object to be imaged is placed.

Superconductive magnets having shielding include those having superconductive shielding coils and those having a cylindrical iron shield. The superconductive shielding coils carry electric currents of generally equal amperage, but in an opposite direction, to the electric current carried in the superconductive main coils. The superconductive shielding coils are positioned radially outward from the superconductive main coils to prevent the high magnetic field created by and surrounding the superconductive main coils from adversely interacting with electronic equipment in the vicinity of the magnet. Likewise, the cylindrical iron shield is positioned radially outward from the superconductive main coils to prevent the high magnetic field created by and surrounding the superconductive main coils from adversely interacting with electronic equipment in the vicinity of the magnet.

Superconductive magnets having superconductive shielding coils use nearly twice as much superconductor, and therefore are more expensive, than superconductive magnets having a cylindrical iron shield. Superconductive magnets having a cylindrical iron shield are too heavy to be placed in medical buildings without expensive floor reinforcement. What is needed is a magnet having shielding which is not as expensive or as heavy as known designs.

BRIEF SUMMARY OF THE INVENTION

In a first expression of the invention, a magnet includes a longitudinally-extending axis, at least one main coil, at least one shielding coil, and at least one magnetizable member. The at least one main coil is generally coaxially aligned with the axis and carries an electric current in a first direction. The at least one shielding coil is generally coaxially aligned with the axis, is positioned radially outward from the at least one main coil, and carries an electric current in an opposite direction to the first direction. The at least one magnetizable member is not carrying an electric current, is positioned radially outward from the at least one main coil, and is positioned radially inward from the at least one shielding coil.

In a second expression of the invention, a closed, superconductive, magnetic-resonance-imaging (MRI) magnet includes a longitudinally-extending axis, longitudinally-outermost superconductive first and second main coils, superconductive first and second shielding coils, and an annularly-cylindrical magnetizable member. The first and second main coils are generally coaxially aligned with the axis and carry an electric current in a first direction. The first and second shielding coils are generally coaxially aligned with the axis, are positioned radially outward from the first and second main coils, and carry an electric current in an opposite direction to the first direction. The magnetizable member is not carrying an electric current, is positioned radially outward from the first and second main coils, is positioned radially inward from the first and second shielding coils, generally completely longitudinally overlaps the first and second main coils, and generally completely longitudinally underlaps the first and second shielding coils.

Several benefits and advantages are derived from the invention. The (at least one) magnetizable member, being located radially inward from the at least one (or the first and second) shielding coil, supplements the strength, and increases the homogeneity of, the magnetic field created, at least in part, by the at least one (or the first and second) main coil. The (at least one) magnetizable member, being located radially outward from the at least one (or the first and second) main coil, provides extra shielding and thus supplements the shielding provided, at least in part, by the at least one (or the first and second) shielding coil. For a 1.5 Tesla superconductive magnet, wherein the at least one (or the first and second) magnetizable member is an annularly-cylindrical iron shield, engineering calculations show superconductor use is reduced by at least 20% while magnet weight is increased by about 100% to generally 15,000 pounds. It is noted that a magnet weighing 15,000 pounds easily can be placed in medical buildings without expensive structural reinforcement. The projected cost savings (mainly in saved superconductor costs) over a similar magnet which relies only on its bigger superconductive shielding coils for shielding is about 10,000 US dollars. The calculated weight of a similar magnet which relies only on iron for its shielding is about 60,000 pounds which prevents it from being placed in medical buildings without expensive floor reinforcement.

DETAILED DESCRIPTION OF THE INVENTION

Figure 1:
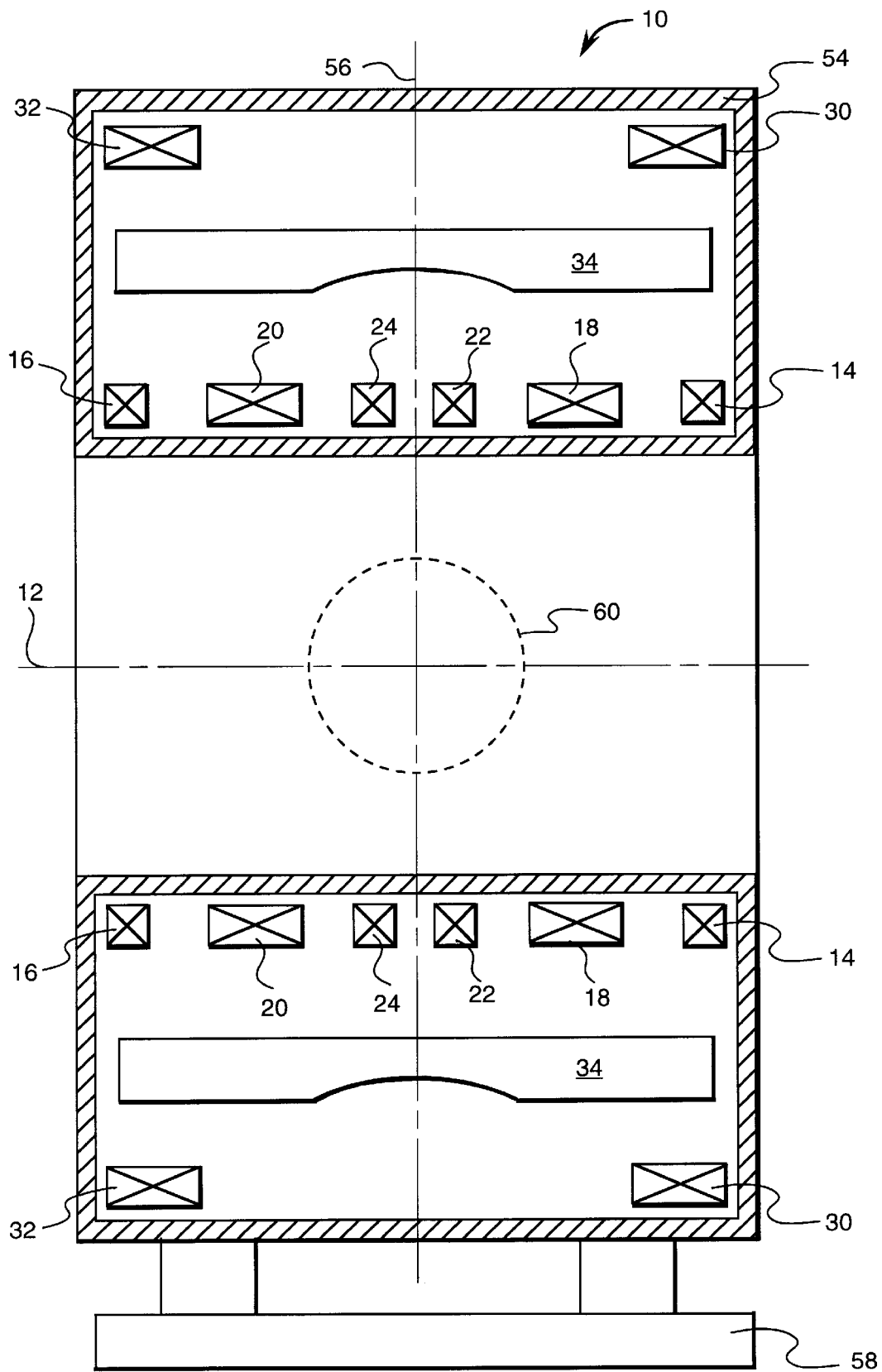
FIG. 1 is a schematic, cross-sectional, side-elevational view of a first embodiment of the magnet of the invention.
Figure 2:
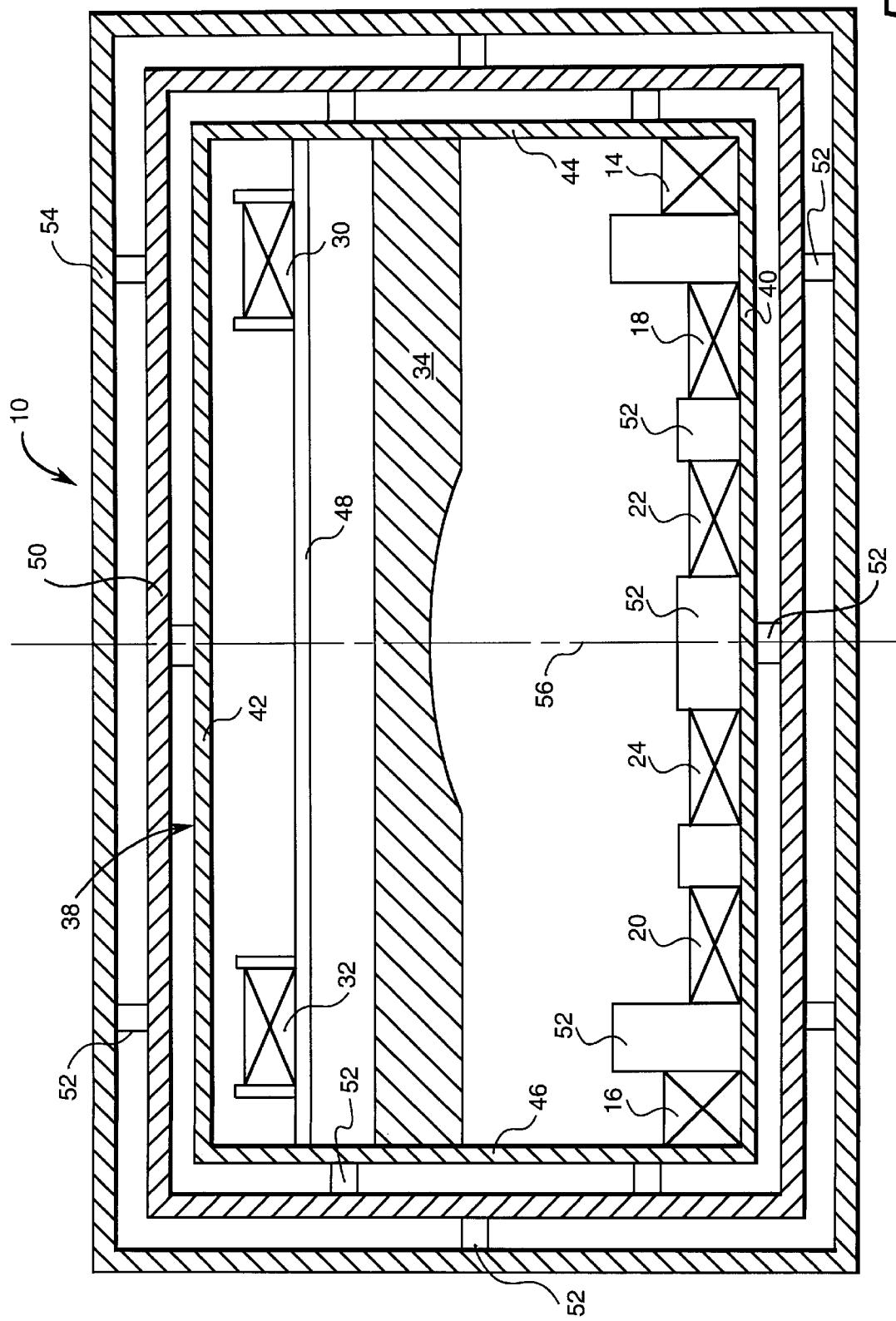
FIG. 2 is a more detailed view of the upper portion of the magnet of FIG. 1.

Referring now to the drawings, FIGS. 1 and 2 show a first embodiment of the magnet 10 of the present invention. In one example, magnet 10 is a closed superconductive magnet. In one application, magnet 10 is part of an MRI (magnetic resonance imaging) system (not shown) used for medical diagnostics and procedures.

In one expression of the first embodiment of the invention, a magnet 10 includes a longitudinally-extending axis 12, at least one main coil 14,16,18, 20, 22, and 24 (hereinafter expressed as 14–24), at least one shielding coil 30 and 32, and at least one magnetizable member 34 which is not carrying an electric current. The at least one main coil 14–24 is generally coaxially aligned with the axis 12 and carries an electric current in a first direction. The first direction is defined to be either a clockwise or a counterclockwise circumferential direction about the axis 12 with any slight longitudinal component of current direction being ignored. The at least one shielding coil 30 and 32 is generally coaxially aligned with the axis 12, is disposed radially outward from the at least one main coil 14–24, and carries an electric current in an opposite direction to the previously-described first direction. The at least one magnetizable member 34 is disposed radially outward from the at least one main coil 14–24 and is disposed radially inward from the at least one shielding coil 30 and 32.

In one example, the at least one shielding coil 30 and 32 consists of at least one superconductive shielding coil. In another example, the at least one main coil 14–24 consists of at least one superconductive main coil. Superconductive cooling may be achieved by employing cryogenic fluids and/or cryocooler coldheads, and the like, as is known to the artisan. As seen in FIG. 2, in one construction, magnet 10 includes an annularly-cylindrical helium (or other cryogenic fluid) vessel 38 having a radially-inner wall 40, a radially-outer wall 42, and first and second longitudinal end walls 44 and 46. The helium vessel 38 encloses the at least one main and shielding coils 14–24 and 30–32 (also expressed as 30 and 32) and the at least one magnetizable member 34. The radially-inner wall 40 defines a coil support for said at least one main coil 14–24, and the at least one main coil 14–24 is wound around the radially-inner wall 40. The at least one magnetizable member 34 is attached to at least one of the first and second longitudinal end walls 44 and 46. The at least one shielding coil 30 and 32 is wound around a coil support 48 which is attached to the first and second longitudinal end walls 44 and 46. At least one thermal shield 50 is spaced apart from (using conventional spacers 52) and generally surrounds the helium vessel 38, and a vacuum enclosure 54 is spaced apart from (using conventional spacers 52) and encloses the at least one thermal shield 50. It is seen from FIG. 1 that magnet 10 is generally symmetrical about a plane (seen on edge as a dashed line 56) which is perpendicular to the axis 12 and which is disposed equidistant from the longitudinal ends of the vacuum enclosure 54. The vacuum enclosure 54 is supported by a floor mount 58. It is noted that, when there is more than one at least one main coil 14–24, conventional spacers 52 may also be used to longitudinally separate and position these coils 14–24.

In one design, the at least one magnetizable member 34 at least partially longitudinally overlaps or underlaps at least one of the at least one main or shielding coils 14–24 and 30–32. In another design, the at least one magnetizable member 34 at least partially longitudinally overlaps at least one of the at least one main coil 14–24 and at least partially longitudinally underlaps at least one of the at least one shielding coil 30 and 32. In a further design, the at least one magnetizable member 34 completely longitudinally overlaps at least one of the at least one main coil 14–24, and, in one variation, the at least one magnetizable member 34 also at least partially longitudinally underlaps at least one of the at least one shielding coil 30 and 32. In one construction, the at least one magnetizable member 34 is at least one annularly-cylindrical magnetizable member generally coaxially aligned with the axis 12.

In another expression of the first embodiment of the invention, a closed, superconductive, magnetic-resonance-imaging (MRI) magnet 10 includes a longitudinally-extending axis 12, longitudinally-outermost superconductive first and second main coils 14 and 16, superconductive first and second shielding coils 30 and 32, and an annularly-cylindrical magnetizable member 34 which is not carrying an electric current. The first and second main coils 14 and 16 are generally coaxially aligned with the axis 12 and carry an electric current in a first direction, as previously defined. The first and second shielding coils 30 and 32 are generally coaxially aligned with the axis 12, are disposed radially outward from the first and second main coils 14 and 16, and carry an electric current in an opposite direction to the previously-described first direction. The magnetizable member 34 is disposed radially outward from the first and second main coils 14 and 16, is disposed radially inward from the first and second shielding coils 30 and 32, generally completely longitudinally overlaps the first and second main coils 14 and 16, and generally completely longitudinally underlaps the first and second shielding coils 30 and 32.

As seen in FIG. 2, in one construction, magnet 10 includes an annularly-cylindrical helium (or other cryogenic fluid) vessel 38 having a radially-inner wall 40, a radially-outer wall 42, and first and second longitudinal end walls 44 and 46. The helium vessel 38 encloses the first and second main and shielding coils 14,16, 30, and 32 and the magnetizable member 34. The radially-inner wall 40 defines a coil support for the first and second main coils 14 and 16, and the first and second main coils 14 and 16 are wound around the radially-inner wall 40. The magnetizable member 34 is attached to the first and second longitudinal end walls 44 and 46. The first and second shielding coils 30 and 32 are wound around a coil support 48 which is attached to the first and second longitudinal end walls 44 and 46.

In one design, the first shielding coil 30 at least partially longitudinally overlaps the first main coil 14, and the second shielding coil 32 at least partially longitudinally overlaps the second main coil 16. In another design, the magnet 10 includes superconductive third and fourth main coils 18 and 20 generally coaxially aligned with the axis 12, disposed radially inward from the magnetizable member 34, disposed longitudinally between the first and second main coils 14 and 16, and carrying an electric current in the previously-described first direction. In one variation, the magnet 10 also includes superconductive fifth and sixth main coils 22 and 24 generally coaxially aligned with the axis 12, disposed radially inward from the magnetizable member 34, disposed longitudinally between the third and fourth main coils 18 and 20, and carrying an electric current in the previously-described first direction. In one example, all of the coils 14–24 carrying an electric current in the previously-described first direction are disposed radially inward from the magnetizable member 34, and in another example, all of the coils 30 and 32 carrying an electric current in the previously-described opposite direction are disposed radially outward from the magnetizable member 34. In one design, the first and second shielding coils 30 and 32 are the only coils carrying an electric current in the previously-described opposite direction that are disposed radially outward from the magnetizable member 34. In one construction, the magnetizable member 34 is generally coaxially aligned with the axis 12.

It is noted that those skilled in the art, using computer simulations based on conventional magnetic field analysis techniques, and using the teachings of the present invention, can design a shielded superconductive magnet 10 of a desired magnetic field strength, a desired level of magnetic field inhomogeneity, and a desired level of shielding (i.e., a desired position of the 5 Gauss stray field from the center of the imaging volume 60 [shown as a dashed circle in FIG. 1] of the superconductive magnet).

The (at least one) magnetizable member 34, being located radially inward from the at least one (or the first and second) shielding coil 30 and 32, supplements the strength, and increases the homogeneity of, the magnetic field created, at least in part, by the at least one (or the first and second) main coil 14–24 (or 14 and 16). The (at least one) magnetizable member 34, being located radially outward from the at least one (or the first and second) main coil 14–24 (or 14 and 16), provides extra shielding and thus supplements the shielding provided, at least in part, by the at least one (or the first and second) shielding coil 30 and 32. For a 1.5 Tesla superconductive magnet, wherein the (at least one) magnetizable member 34 is an annularly-cylindrical iron shield, engineering calculations show superconductor use is reduced by at least 20% while magnet weight is increased by about 100% to generally 15,000 pounds. It is noted that a magnet weighing 15,000 pounds easily can be placed in medical buildings without expensive structural reinforcement. The projected cost savings (mainly in saved superconductor costs) over a similar magnet which relies only on its bigger superconductive shielding coils for shielding is about 10,000 US dollars. The calculated weight of a similar magnet which relies only on iron for its shielding is about 60,000 pounds which prevents it from being placed in medical buildings without expensive floor reinforcement.

In certain applications, as can be appreciated by the artisan, the magnetizable member 34: can have a uniform or varying radial thickness throughout its longitudinal length, can have a step recess instead of the concave recess shown in FIGS. 1 and 2, can be replaced by two radially-spaced-apart and full-longitudinal-length magnetizable members, or can be supplemented by one or more pairs of short-longitudinal-length magnetizable members which are radially spaced apart from the magnetizable member 34. It is noted that all such replacement and supplemental magnetizable members are disposed radially outward from the at least one (or first and second) main coil 14–24 and radially inward from the at least one (or first and second) shielding coil 30 and 32.

Although not shown in the figures, engineering calculations show that adding first and second superconductive correction coils will shorten the magnet wherein the (at least one) magnetizable member is replaced by at least two magnetizable members (which is equivalent to having the longitudinal portion of the magnetizable member 34 removed leaving two longitudinal end portions). The correction coils are generally coaxially aligned with the axis, disposed radially inward from the (at least one) magnetizable member 34, and carry an electric current in the previously-described opposite direction. The first correction coil is disposed longitudinally between the first and third main coils 14 and 18, and the second correction coil is disposed longitudinally between the second and fourth main coils 16 and 20. Engineering calculations also show that first and second magnetizable rings (not shown in the figures) can be substituted for the first and second correction coils to also shorten the magnet. The first and second magnetizable rings should result in a net longitudinally-inward em force experienced by the first and second main coils 14 and 16 thereby removing the em force preciously experienced by the first and second longitudinal end walls 44 and 46.

The foregoing description of two expressions of a first embodiment of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

What is claimed is:

1. A magnet comprising:
    a) a longitudinally-extending axis;
    b) at least one main coil coaxially aligned about said longitudinally-extending axis and carrying an electric current in a first direction;
    c) at least one shielding coil coaxially aligned about said axis, disposed radially outward from said at least one main coil, and carrying an electric current in an opposite direction to said first direction; and
    d) a magnetizable member which is not carrying an electric current, which is disposed radially outward from said at least one main coil, and which is disposed radially inward from said at least one shielding coil;
said magnetizable member being ring shaped and positioned intermediate and coaxial with said at least one main coil and said at least one shielding coil; and
said magnetizable member extending longitudinally along said axis to longitudinally overlap said at least one main magnet coil and said at least one shielding coil.

2. The magnet of claim 1, wherein said at least one shielding coil comprises a plurality of superconductive shielding coils and said magnetizable member overlaps said plurality of superconductive shielding coils.

3. The magnet of claim 1, wherein said at least one main coil consists of a plurality of superconductive main coils, and said magnetizable member overlaps said plurality of said superconductive main coils.

4. The magnet of claim 1, wherein said magnetizable member is a cylinder concentric about said longitudinal axis.

5. The magnet of claim 4, wherein said magnetizable member completely longitudinally overlaps at least one of said at least one main coil.

6. The magnet of claim 5, wherein said magnetizable member at least partially longitudinally underlaps at least one of said at least one shielding coil.

7. The magnet of claim 1, wherein said at least one magnetizable member is an annularly-cylindrical magnetizable member coaxially aligned with said axis.

8. The magnet of claim 1, also including an annularly-cylindrical helium vessel having a radially-inner wall, a radially-outer wall, and first and second longitudinal end walls, wherein said helium vessel encloses said at least one main and shielding coils and said at least one magnetizable member, wherein said radially-inner wall defines a coil support for said at least one main coil, and wherein said at least one main coil is wound around said radially-inner wall.

9. The magnet of claim 8, wherein said magnetizable member is attached to at least one of said first and second longitudinal end walls.

10. A closed, superconductive, magnetic-resonance-imaging (MRI) magnet comprising:
    a) a longitudinally-extending axis;
    b) longitudinally-outermost superconductive first and second main coils generally coaxially aligned with said axis and carrying an electric current in a first direction;
    c) superconductive first and second shielding coils generally coaxially aligned with said axis, disposed radially outward from said first and second main coils, and carrying an electric current in an opposite direction to said first direction; and
    d) an annularly-cylindrical magnetizable member which is not carrying an electric current, which is disposed radially outward from said first and second main coils, which is disposed radially inward from said first and second shielding coils, which generally completely longitudinally overlaps said first and second main coils, and which generally completely longitudinally underlaps said first and second shielding coils.

11. The magnet of claim 10, wherein said first shielding coil at least partially longitudinally overlaps said first main coil and wherein said second shielding coil at least partially longitudinally overlaps said second main coil.

12. The magnet of claim 10, wherein all of said coils carrying an electric current in said first direction are disposed radially inward from said magnetizable member.

13. The magnet of claim 10, wherein said magnetizable member is coaxially aligned with said axis.

14. The magnet of claim 13, also including superconductive third and fourth main coils generally coaxially aligned with said axis, disposed radially inward from said magnetizable member, disposed longitudinally between said first and second main coils, and carrying an electric current in said first direction.

15. The magnet of claim 14, also including superconductive fifth and sixth main coils generally coaxially aligned with said axis, disposed radially inward from said magnetizable member, disposed longitudinally between said third and fourth main coils, and carrying an electric current in said first direction.

16. The magnet of claim 15, wherein all of said coils carrying an electric current in said opposite direction are disposed radially outward from said magnetizable member.

17. The magnet of claim 16, wherein said first and second shielding coils are the only coils carrying an electric current in said opposite direction that are disposed radially outward from said magnetizable member.

18. The magnet of claim 10, also including an annularly-cylindrical helium vessel having a radially-inner wall, a radially-outer wall, and first and second longitudinal end walls, wherein said helium vessel encloses said first and second main and shielding coils and said magnetizable member, wherein said radially-inner wall defines a coil support for said first and second main coils, and wherein said first and second main coils are wound around said radially-inner wall.

19. The magnet of claim 18, wherein said magnetizable member is attached to said first and second longitudinal end walls.

* * * * *